United States Patent
Lim et al.

(10) Patent No.: US 6,451,694 B1
(45) Date of Patent: Sep. 17, 2002

(54) CONTROL OF ABNORMAL GROWTH IN DICHLORO SILANE (DCS) BASED CVD POLYCIDE WSIX FILMS

(75) Inventors: Jeon-Sig Lim, Gyeonggi-do; Jin-Ho Jeon, Seoul; Jong-Seung Yi, Gyeonggi-do; Chul-Hwan Choi, Seoul, all of (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/826,203

(22) Filed: Apr. 4, 2001

(51) Int. Cl.[7] ............................................. H01L 21/44
(52) U.S. Cl. ................. 438/683; 438/764; 438/592; 438/680; 438/597; 438/588; 438/903
(58) Field of Search ........................... 438/764, 683, 438/592, 680, 301, 597, 905, 588

(56) References Cited

U.S. PATENT DOCUMENTS

| | | | |
|---|---|---|---|
| 5,231,056 A | 7/1993 | Sandhu | 437/200 |
| 5,425,392 A | 6/1995 | Thakur et al. | 437/173 |
| 5,441,904 A | 8/1995 | Kim et al. | 437/40 |
| 5,786,027 A | 7/1998 | Rolfson | 427/124 |
| 5,817,576 A | 10/1998 | Tseng et al. | 438/680 |
| 5,877,074 A | 3/1999 | Jeng et al. | 438/592 |
| 5,997,950 A | 12/1999 | Telford et al. | 427/255.39 |
| 6,221,771 B1 | 4/2001 | Ban et al. | 438/683 |

FOREIGN PATENT DOCUMENTS

| | | |
|---|---|---|
| DE | 19840236 A1 | 7/1999 |
| EP | 0591086 A2 | 6/1994 |
| EP | 0772231 A2 | 7/1997 |
| EP | 0785574 A2 | 7/1997 |
| EP | 0785574 A3 | 7/1998 |
| EP | 0772231 A3 | 9/1998 |
| JP | 06163426 A | 6/1994 |
| JP | 10294295 A | 4/1998 |

*Primary Examiner*—Long Pham
*Assistant Examiner*—Scott Brairton
(74) *Attorney, Agent, or Firm*—Mills & Onello, LLP

(57) ABSTRACT

In a process for mitigating and/or eliminating the abnormal growth of underlying polysilicon in dichloro silane-based CVD polycide WSix films, a first technique conducts the deposition of the underlying polysilicon layer at a temperature that substantially avoids crystallization of the underlying polysilicon. A second approach reduces the exposure (for example time period and or concentration) of the mono-silane $SiH_4$ post flush, so as to avoid infusion of silicon into the underlying polysilicon layer, and resulting abnormal growth. In this manner, abnormal effects, such as stress fractures formed in subsequent layers, can be eliminated.

25 Claims, 3 Drawing Sheets

CONTROL OF ABNORMAL GROWTH IN DICHLORO SILANE (DCS) BASED CVD POLYCIDE WSIX FILMS

BACKGROUND OF THE INVENTION

DCS (Dichloro-Silane ($SiH_2C_2$))-based $WSi_x$ films have become desirable in semiconductor fabrication processes due to their low resistance properties. Such films are especially amenable for use in the formation of gate/bit line interfaces for transistors. However, traditional approaches for fabrication of such films, such as those disclosed in U.S. Pat. No. 5,786,027, to Rolfson, and U.S. Pat. No. 5,425,392, to Thakur et al., result in the abnormal growth of polysilicon in crystallized regions of the wafer, which in turn, decreases production yield.

In the conventional approach, a polysilicon seed layer is initially deposited on an underlying substrate, for example, above an active region of a transistor. Transistor gate layers and/or bit lines are provided above the polysilicon layer through the layering of a DCS seed using DCS gas deposition. Next, the silicon-rich DCS layer undergoes nucleation by exposure to $WSi_x$, followed by bulk deposition of Tungsten and polysilicon layers. This is followed by a DCS post flush, that serves to eliminate impurities such as Cl and F that remain as a result of nucleation and bulk deposition the $WSi_x$ layer. A mono-silane (SiH4) post flush is then performed to eliminate high stress that exists between the Tungsten and polysilicon layers, which can lead to delamination of the layers. In general, the longer the mono-silane flush is performed, the greater the improvement in stress reduction. Following this, gate and/or bit line patterns are provided over the resulting structure, and subsequent layers are formed.

During formation of the polysilicon layer, the substrate is heated to the dissolution temperature of the DCS gas, i.e. 620 C, in order to reduce sheet resistance in the layer. However, this causes the underlying polysilicon layer to become crystallized, which in turn, leads to its abnormal growth. This, in turn, can cause stress fractures that have deleterious effects, i.e. surface cracking, during subsequent stages of the process.

Additionally, while the mono-silane flush serves to reduce stress between the $WSi_x$ and polysilicon layers, it also causes further infusion of Si into the underlying polysilicon layer, which can likewise lead to its abnormal growth, along with stated adverse effects on the process and device yield.

SUMMARY OF THE INVENTION

To address the limitations of conventional approaches, the method of the present invention provides for the fabrication DCS-based films, while mitigating or eliminating the effects of abnormal polysilicon growth. A first approach conducts the deposition of the underlying polysilicon layer at a temperature that substantially avoids crystallization of the polysilicon. A second approach reduces the exposure level (for example time period and/or concentration level) for the mono-silane $SiH_4$ post flush, so as to avoid infusion of silicon into the underlying polysilicon layer, and resulting abnormal growth of the polysilicon.

In a first embodiment, the present invention is directed to a method of forming a double-layered semiconductor film. A polysilicon layer is provided on an underlying substrate in a diffusion process conducted at a first temperature that substantially avoids crystallization of the polysilicon. The temperature of the polysilicon layer is raised to a second temperature. The polysilicon layer is flushed with a first flush material to provide a transition layer. The polysilicon layer is next flushed with a second flush material to provide a second material layer over the polysilicon layer, the transition layer providing adherence characteristics between the second material layer and the polysilicon layer. A combination of the first flush material and the second flush material are provided to deposit a bulk second material layer on the transition layer. The bulk second material layer is flushed with the second flush material to remove impurities. The bulk second material layer is then flushed with the first flush material to mitigate stress between the polysilicon layer and second material layer.

Flushing of the bulk second material layer with the first flush material is preferably limited in time duration so as to substantially avoid abnormal growth of the underlying polysilicon layer. Alternatively, flushing of the bulk second material layer with the first flush material can be limited in concentration to substantially avoid abnormal growth of the underlying polysilicon layer.

The first temperature is preferably equal to or less than 530 Celsius. The second temperature is preferably equal to or greater than 620 Celsius, in order to reduce resistivity in the resulting double-layered semiconductor film.

The polysilicon layer is preferably pre-clean following its deposit, which deposit can be conducted at atmospheric pressure.

The second material layer preferably comprises tungsten silicide $WSi_x$.

Following flushing of the polysilicon layer with a second flush material, nucleation of the second material layer can be performed to reduce grain size of the second material layer. Following flushing of the bulk second material layer with the second flush material, nucleation of the bulk second material layer can be provided to reduce grain size of a top portion of the bulk second material layer. The first flush material may comprise silane SiH4 and the second flush material may comprise di-chloro silane (DCS) $SiH_2Cl_2$ and tungsten fluoride $WF_6$.

In a second aspect, the present invention comprises a method of forming a double-layered semiconductor film. A polysilicon layer is provided on an underlying substrate at a first temperature. The temperature of the polysilicon layer is raised to a second temperature. The polysilicon layer is flushed with a first flush material to provide a transition layer. The polysilicon layer is next flushed with a second flush material to provide a second material layer over the polysilicon layer, the transition layer providing adherence characteristics between the second material layer and the polysilicon layer. A combination of the first flush material and the second flush material are provided on the resulting structure to deposit a bulk second material layer on the transition layer. The bulk second material layer is flushed with the second flush material to remove impurities. The bulk second material layer is flushed with the first flush material to mitigate stress between the polysilicon layer and second material layer, the exposure of first flush material being limited so as to substantially avoid abnormal growth of the underlying polysilicon layer.

In a preferred embodiment, the step of providing a polysilicon layer is performed in a diffusion process conducted at the first temperature so as to substantially avoid crystallization of the polysilicon.

The exposure of first flush material is preferably limited in time duration and/or concentration so as to substantially avoid abnormal growth of the underlying polysilicon layer.

BRIEF DESCRIPTION OF THE DRAWINGS

The foregoing and other objects, features and advantages of the invention will be apparent from the more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF PREFERRED EMBODIMENTS

According to the present invention, the abnormal growth of polysilicon is mitigated and/or eliminated, thereby increasing device yield. In a first method, the temperature under which polysilicon deposition occurs is set at a level that substantially avoids crystallization of the polysilicon. In a second method, the mono-silane ($SiH_4$) flush, used for reducing stress between the $WSi_x$ and the polysilicon layers, is limited in exposure (for example time duration and/or concentration) so as to substantially avoid abnormal growth of the underlying polysilicon layer. In a third method, a top nucleation barrier layer is provided on the bulk DCS layer so as to prevent infusion of silicon during the subsequent mono-silane flush, and to further allow processing at a higher temperature, in order to reduce resistivity.

Table I is a chart outlining the steps of a preferred technique for formation of a DCS-polycide $WSi_x$ films. The table provides details on process flow, including the pressure of the chamber (in units of mTorr), and concentrations of various process gasses (in units of sccm), for each step of the process.

TABLE 1

DCS-based $WSi_x$ film formation

| Ref. | STEP | Pressure (mTorr) | $SiH_4$ (sccm) | DCS (sccm) | Ar (sccm) | $WF_6$ (sccm) |
|---|---|---|---|---|---|---|
| 102 | pump down | 0 | 0 | 0 | 0–50 | 0104 |
| 104 | heat up | <7 | 0 | 0 | 0–1000 | 0 |
| 106 | pre-$SiH_4$ flush | <7 | 300 | 0 | | 0 |
| 108 | pre-DCS flush | 1–4 | 0 | 1–300 | | 1–30 |
| 110 | $_{WSix}$ nucleation | 1–4 | 0 | 1–300 | | 1–30 |
| 112 | $_{WSix}$ bulk deposition | 1–4 | 0 | 1–300 | | 1–50 |
| 114 | DCS post flush | 1–4 | 0 | 1–300 | | 0 |
| 116 | $SiH_4$ post flush | 1–4 | 300 | 0 | | 0 |
| 118 | pump down | 0 | 0 | 0 | 0 | 0 |

Figure 1:
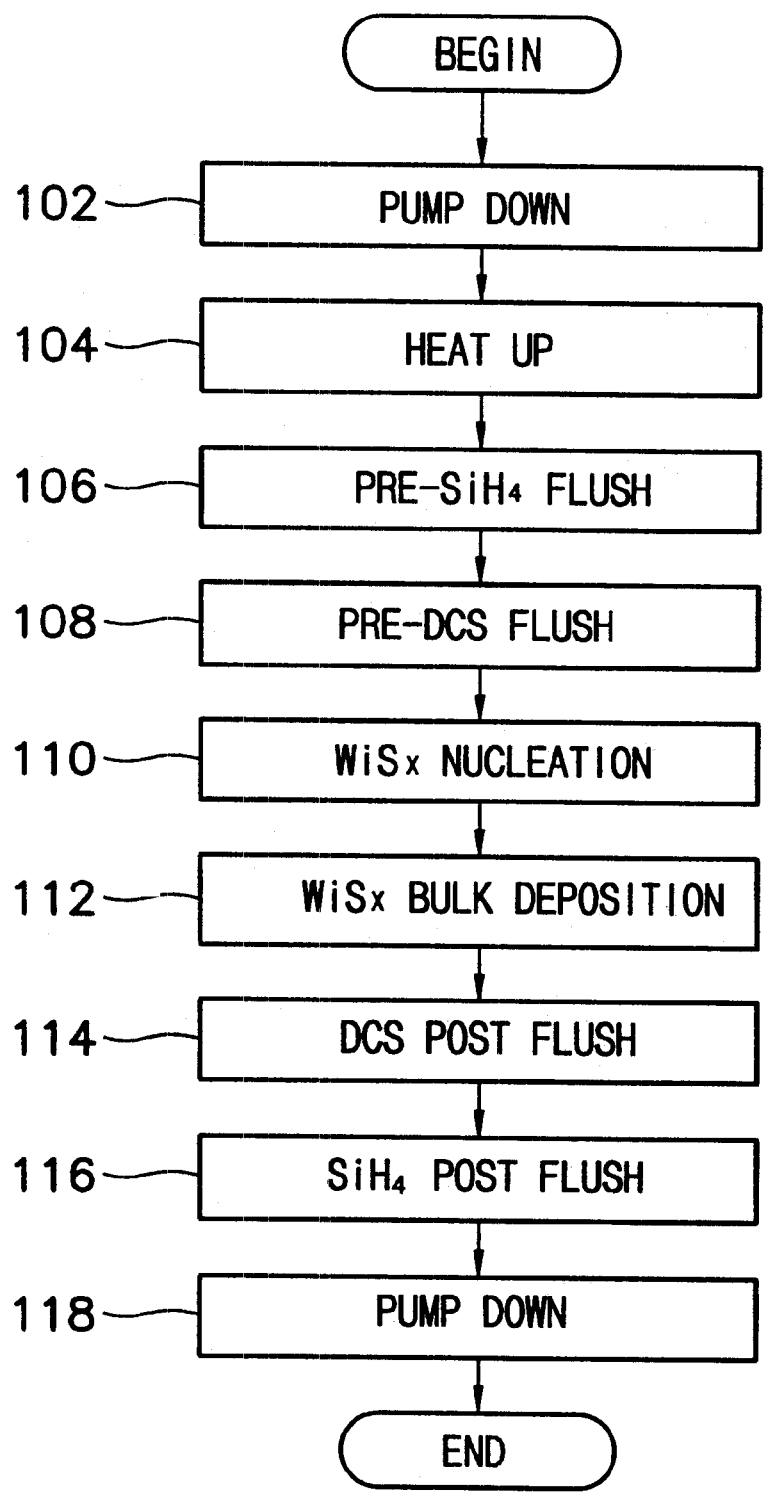
FIG. 1 is a flow diagram of a method for forming a DCS-based $WSi_x$ film, in accordance with the present invention.

Reference is made to the flow diagram of FIG. 1. The reference numerals of FIG. 1 correspond to those of Table I.

Initially, a substrate previously having undergone polysilicon layer formation and pre-cleaning is provided in a process chamber at atmospheric pressure and room temperature. During a pump-down process 102, a vacuum is drawn in the process chamber, for example to a pressure of $10^6$ mTorr. During a heat-up process 104, the temperature of the substrate is raised to 620 C, a temperature that is sufficient for the dissolution of the DCS layer.

In step 106, a pre-flush of mono-silane ($SH_4$) is next provided at a concentration of 300 sccm, the concentration being regulated, for example, by a mass flow controller. During this step the pressure is maintained at a level less than 7 mTorr. A preferred time duration is on the order of 40 seconds. The time duration can be decreased, in order to increase manufacturing throughput. However, any decrease in the exposure time should be compensated for by a corresponding increase in mono-silane concentration.

Next, in step 108, a DCS pre-flush process is conducted at a pressure of 1~4 mTorr (for example 1.2 mTorr), and with a concentration of 1~200 sccm (for example 100 sccm) DCS, 0~1000 scam (for example 500 sccm) Ar, and 1~30 sccm (for example 2 sccm) $WF_6$. The DCS pre-flush serves to introduce a DCS seed upon which a bulk DCS layer can be deposited in the subsequent bulk deposit step. The DCS seed provides for adherence characteristics between the underlying polysilicon layer and the bulk $WSi_x$ film.

During nucleation, in step 110, a silicon rich layer is provided on the order of 100 Angstroms in depth to serve as a transition layer between the underlying polysilicon layer and the subsequent bulk-DCS layer. The nucleation step serves to decrease the grain size of the tungsten silicide $WSi_x$ layer, at its interface with the underlying polysilicon layer, providing a low-resistivity interface with the polysilicon layer, and further providing a suitable foundation for a bulk tungsten silicide layer to be formed above the nucleation layer. As an example, the nucleation step may be performed for 12 seconds, with a DCS concentration on the order of 106 sccm, and a $WF_6$ concentration on the order of 5.5 sccm.

Following formation of the nucleation layer, a bulk deposition of dichloro silane-tungsten silicide ($DCS\text{-}WSi_x$) is provided on the resulting structure, in step 112. During this step, the gate, or bit line, is grown above the nucleation layer to a desired depth. Grain size of the bulk DCS layer is controlled by adjusting the respective concentrations of DCS and $WF_6$ gasses. As an example, the bulk deposition period may last for a minute, with concentrations of DCS on the order of 180 sccm and $WF_6$ on the order of 13 sccm.

Next, a DCS flush process is performed in step 114 to eliminate impurities such as Cl and F that remain as a result of previous nucleation and bulk deposition processes. As shown in the table, during this step, the $WF_6$ concentration is eliminated, while the DCS concentration remains, for example at 175 sccm, for a flush period, for example on the order of 10 seconds. The DCS gas reacts with the remaining impurities in order to remove them, for improving the resulting resistivity of the DCS layer.

Following this, in step 116, a mono-silane ($SiH_4$) post flush is performed in order to eliminate stress (and possible delamination) that is generated between the tungsten and the polysilicon layers. As an example, the mono-silane post flush may be performed for a period of 3 seconds at a concentration of 300 sccm of $SiH_4$. In general, as the time of the mono-silane post flush increases, so too does the improvement in stress reduction between the layers. However, this process results in an infusion of Si into the underlying polysilicon layer, which can cause abnormal growth of the layer, leading to cracking and bowing of subsequent upper layers. For this reason, the process of the present invention limits the time duration of the mono-silane post flush to a duration that substantially avoids abnormal growth of the underlying polysilicon layer, for example limiting the duration to less than 10 seconds. Alternatively, the concentration of the mono-silane post flush can be reduced so as to avoid over-infusion of silicon into the underlying polysilicon layer.

Following mono-silane post flush, a pump down procedure 116 purges the reaction chamber gasses and reduces the pressure down to ambient pressure. The processed wafer can then be removed for subsequent processing.

Figure 2:
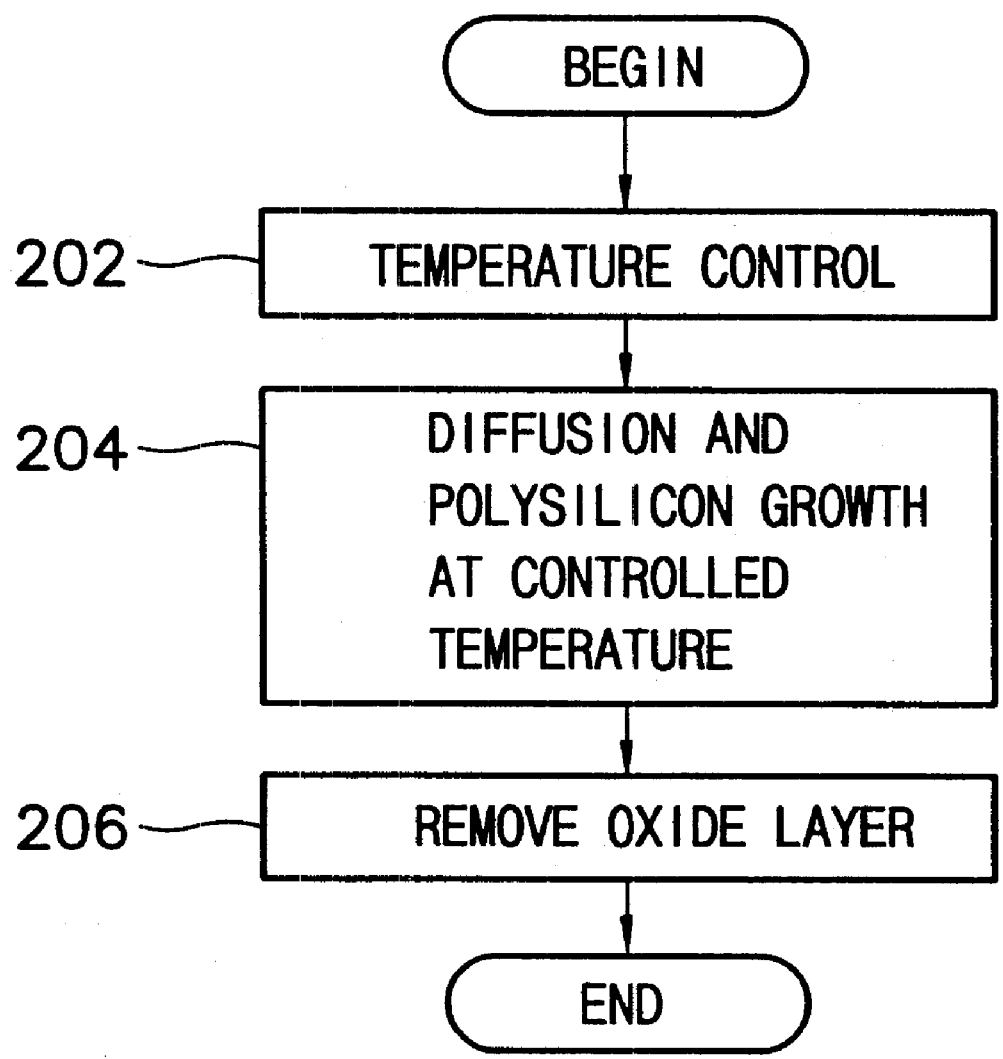
FIG. 2 is a flow diagram of a method for forming the polysilicon layer at a controlled temperature so as to avoid polysilicon crystallization, in accordance with the present invention.

FIG. 2 is a flow diagram of a preferred embodiment of the process of the present invention. As explained above, during the mono-silane post flush (step 116), the infusion of silicon into the underlying polysilicon layer can cause its abnormal growth, resulting in cracking and bowing of the upper layers. However, the present invention recognizes that by controlling the temperature of the deposition of the original polysilicon layer, the polysilicon layer can be made more resistant to such subsequent growth resulting from silicon infusion. With reference to FIG. 2, step 202, the temperature at which the diffusion process for forming the polysilicon can be limited to a temperature less than 550 C. At a temperature less than 550 C, the resulting structure of the polysilicon layer is amorphous; while at temperatures greater than 550 C, the structure is crystalline. An amorphous structure is more resistant to subsequent growth due to later infusion of silicon during the mono-silane post-flush, as compared to a crystalline structure. For this reason, the present invention, during step 204 of FIG. 2, provides for diffusion and growth of the polysilicon layer at a controlled temperature, for example 530 C, so as to avoid or limit crystallization of the polysilicon. Following this, any resulting oxide layer is removed at step 206, and the polysilicon layer is ready for tungsten-DCS processing, in accordance with the process of FIG. 1.

Figure 3:
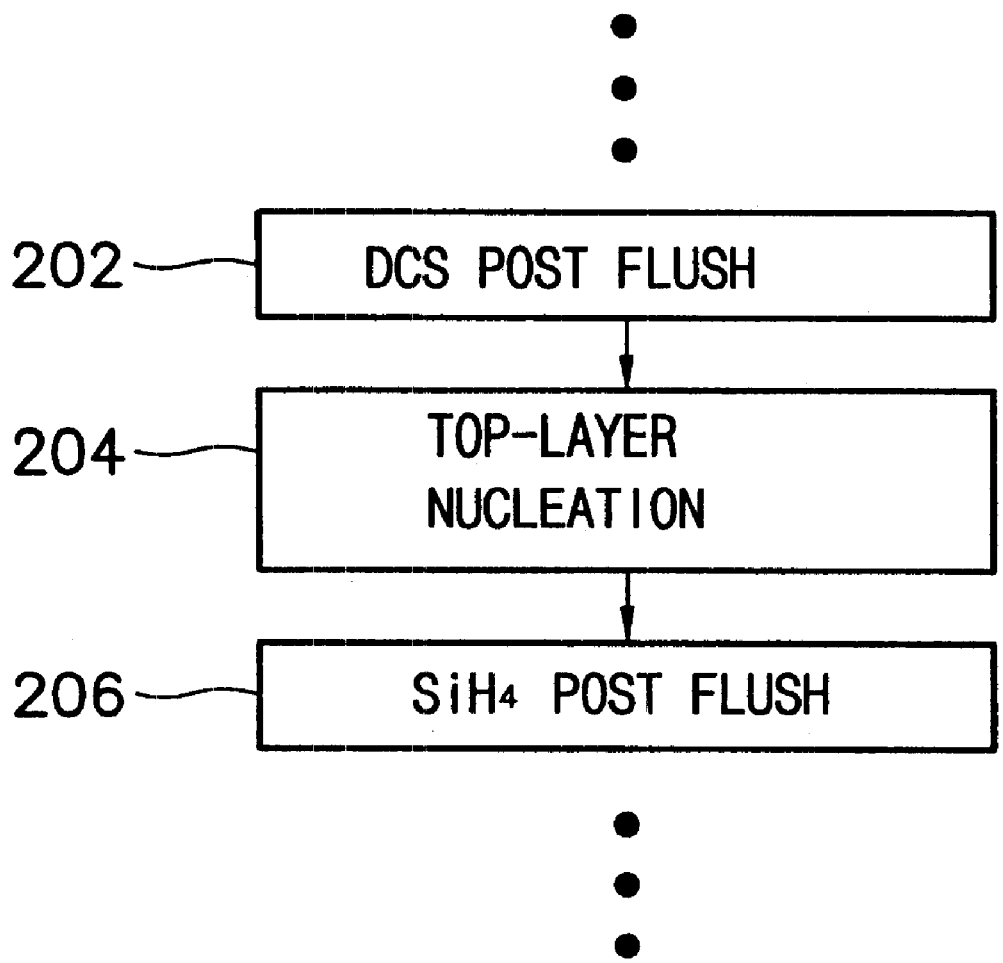
FIG. 3 is a flow diagram of a method for forming a barrier layer on the nucleation layer to prevent further infusion of silicon during a subsequent mono-silane flush, in accordance with the present invention.

FIG. 3 is a flow diagram of another preferred embodiment of the present invention. In this embodiment, a second nucleation layer is provided above the bulk-DCS layer to reduce the grain structure of the top portion of the bulk layer. Following the DCS post flush step 114, and prior to the mono-silane post flush step 116, a second nucleation layer is provided during step 208. The process details are, for example, similar to those described above for processing of the first nucleation layer. In this manner, the grain size of the bulk layer is reduced in the top portion of the bulk layer. Therefore, when the mono-silane flush is performed at step 116, the relatively small grain size of the top nucleation layer prevents silicon from infusing into the underlying polysilicon layer, thereby mitigating and/or preventing abnormal growth of the underlying polysilicon. An advantage of this approach is that it allows for use of a higher-temperature polysilicon layer, for example a polysilicon layer formed at a diffusion temperature greater than 550 C, and therefore including crystallized polysilicon, since there is less danger of infusion of silicon during the mono-silane post flush, due to the small grain size of the top nucleation layer.

While this invention has been particularly shown and described with references to preferred embodiments thereof, it will be understood by those skilled in the art that various changes in form and details may be made herein without departing from the spirit and scope of the invention as defined by the appended claims.

We claim:

1. A method of forming a double-layered semiconductor film comprising:
   providing a polysilicon layer on an underlying substrate in a diffusion process conducted at a first temperature that substantially avoids crystallization of the polysilicon;
   raising the temperature of the polysilicon layer to a second temperature;
   flushing the polysilicon layer with a first flush material to provide a transition layer;
   flushing the polysilicon layer with a second flush material to provide a second material layer over the polysilicon layer, the transition layer providing adherence characteristics between the second material layer and the polysilicon layer;
   providing a combination of the first flush material and the second flush material to deposit a bulk second material layer on the transition layer;
   flushing the bulk second material layer with the second flush material to remove impurities; and
   flushing the bulk second material layer with the first flush material to mitigate stress between the polysilicon layer and second material layer.

2. The method of claim 1 wherein flushing the bulk second material layer with the first flush material is limited in time duration to substantially avoid abnormal growth of the underlying polysilicon layer.

3. The method of claim 1 wherein flushing the bulk second material layer with the first flush material is limited in concentration to substantially avoid abnormal growth of the underlying polysilicon layer.

4. The method of claim 1 wherein the first temperature is equal to or less than 530 Celsius.

5. The method of claim 1 wherein the second temperature is equal to or greater than 620 Celsius.

6. The method of claim 1 wherein the second temperature is raised to a level greater than 620 Celsius to reduce resistivity in the resulting double-layered semiconductor film.

7. The method of claim 1 further comprising following providing the polysilicon layer, pre-cleaning the polysilicon layer.

8. The method of claim 1 wherein providing a polysilicon layer is conducted at atmospheric pressure.

9. The method of claim 1 wherein the second material layer comprises tungsten silicide $WSi_x$.

10. The method of claim 1 further comprising following flushing of the polysilicon layer with a second flush material, providing nucleation of the second material layer to reduce grain size of the second material layer.

11. The method of claim 1 further comprising following flushing the bulk second material layer with the second flush material, providing nucleation of the bulk second material layer to reduce grain size of a top portion of the bulk second material layer.

12. The method of claim 1 wherein the first flush material comprises silane $SiH_4$ and wherein the second flush material comprises di-chloro silane (DCS) $SiH_2Cl_2$ and tungsten fluoride $WF_6$.

13. A method of forming a double-layered semiconductor film comprising:
   providing a polysilicon layer on an underlying substrate at a first temperature;
   raising the temperature of the polysilicon layer to a second temperature;
   flushing the polysilicon layer with a first flush material to provide a transition layer;
   flushing the polysilicon layer with a second flush material to provide a second material layer over the polysilicon layer, the transition layer providing adherence characteristics between the second material layer and the polysilicon layer;
   providing a combination of the first flush material and the second flush material to deposit a bulk second material layer on the transition layer;
   flushing the bulk second material layer with the second flush material to remove impurities; and flushing the bulk second material layer with the first flush material to mitigate stress between the polysilicon layer and second material layer, the exposure of first flush material being limited so as to substantially avoid abnormal growth of the underlying polysilicon layer.

14. The method of claim 13 wherein providing a polysilicon layer is performed in a diffusion process conducted at the first temperature so as to substantially avoid crystallization of the polysilicon.

15. The method of claim 13 wherein the exposure of first flush material is limited in time duration to substantially avoid abnormal growth of the underlying polysilicon layer.

16. The method of claim 14 wherein the exposure of first flush material is limited in concentration to substantially avoid abnormal growth of the underlying polysilicon layer.

17. The method of claim 14 wherein the first temperature is equal to or less than 530 Celsius.

18. The method of claim 14 wherein the second temperature is equal to or greater than 620 Celsius.

19. The method of claim 14 wherein the second temperature is raised to a level greater than 620 Celsius to reduce resistivity in the resulting double-layered semiconductor film.

20. The method of claim 14 further comprising following providing the polysilicon layer, pre-cleaning the polysilicon layer.

21. The method of claim 14 wherein providing a polysilicon layer is conducted at atmospheric pressure.

22. The method of claim 14 wherein the second material layer comprises tungsten silicide $WSi_x$.

23. The method of claim 14 further comprising following flushing of the polysilicon layer with a second flush material, providing nucleation of the second material layer to reduce grain size of the second material layer.

24. The method of claim 14 further comprising following flushing the bulk second material layer with the second flush material, providing nucleation of the bulk second material layer to reduce grain size of a top portion of the bulk second material layer.

25. The method of claim 14 wherein the first flush material comprises silane $SiH_4$ and wherein the second flush material comprises di-chloro silane (DCS) $SiH_2Cl_2$ and tungsten fluoride $WF_6$.

* * * * *